United States Patent
Lung et al.

(10) Patent No.: US 9,082,954 B2
(45) Date of Patent: Jul. 14, 2015

(54) PCRAM WITH CURRENT FLOWING LATERALLY RELATIVE TO AXIS DEFINED BY ELECTRODES

(75) Inventors: Hsiang-Lan Lung, Dobbs Ferry, NY (US); Chung Hon Lam, Peekskill, NY (US)

(73) Assignees: Macronix International Co., Ltd., Hsinchu (TW); International Business Machines, Armonk, NY (US)

( * ) Notice: Subject to any disclaimer, the term of this patent is extended or adjusted under 35 U.S.C. 154(b) by 478 days.

(21) Appl. No.: 13/210,020

(22) Filed: Aug. 15, 2011

(65) Prior Publication Data

US 2012/0075925 A1    Mar. 29, 2012

Related U.S. Application Data

(60) Provisional application No. 61/386,389, filed on Sep. 24, 2010.

(51) Int. Cl.
    *G11C 11/00* (2006.01)
    *H01L 45/00* (2006.01)

(52) U.S. Cl.
    CPC ............ *H01L 45/06* (2013.01); *H01L 45/1246* (2013.01); *H01L 45/144* (2013.01); *H01L 45/16* (2013.01)

(58) Field of Classification Search
    USPC .......................................................... 365/163
    See application file for complete search history.

(56) References Cited

U.S. PATENT DOCUMENTS

| | | |
|---|---|---|
| 5,166,758 A | 11/1992 | Ovshinsky et al. |
| 5,389,566 A | 2/1995 | Lage |
| 5,687,112 A | 11/1997 | Ovshinsky |
| 5,751,012 A | 5/1998 | Wolstenholme et al. |
| 5,789,758 A | 8/1998 | Reinberg |
| 6,507,061 B1 | 1/2003 | Hudgens et al. |
| 6,555,858 B1 | 4/2003 | Jones et al. |
| 6,579,760 B1 | 6/2003 | Lung |
| 6,586,761 B2 | 7/2003 | Lowrey |
| 6,815,704 B1 | 11/2004 | Chen |
| 6,897,467 B2 | 5/2005 | Doan et al. |
| 7,018,911 B2 | 3/2006 | Lee et al. |
| 7,394,089 B2 | 7/2008 | Doyle et al. |

(Continued)

FOREIGN PATENT DOCUMENTS

| | | |
|---|---|---|
| CN | 1554125 A | 12/2004 |
| CN | 101461071 | 6/2009 |

OTHER PUBLICATIONS

Horii H., et al., "A Novel Cell Technology Using N-doped GeSbTe Films for Phase Change RAM," 2003 Symp. on VLSI Technology, Digest of Technical Papers, pp. 177-178.

(Continued)

*Primary Examiner* — Kretelia Graham
(74) *Attorney, Agent, or Firm* — Kenta Suzue; Haynes Beffel & Wolfeld LLP

(57) ABSTRACT

An improved phase change memory device has a phase change structure including a thin part between a contact surface of an electrode and a dielectric structure. For example, the thin part has a maximum thickness that is smaller than a maximum width of the contact surface of the electrode. In another example, the phase change structure surrounds the dielectric structure. Several variations improve the contact between the phase change structure and an electrode.

22 Claims, 19 Drawing Sheets

(56) References Cited

U.S. PATENT DOCUMENTS

| | | |
|---|---|---|
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,642,125 B2 | 1/2010 | Lung et al. |
| 7,671,360 B2 * | 3/2010 | Sato et al. .................. 257/42 |
| 7,718,989 B2 | 5/2010 | Lai et al. |
| 7,728,319 B2 | 6/2010 | Goux et al. |
| 7,763,878 B2 | 7/2010 | Horii et al. |
| 7,778,063 B2 | 8/2010 | Brubaker et al. |
| 7,855,378 B2 | 12/2010 | Lin et al. |
| 7,868,313 B2 | 1/2011 | Breitwisch et al. |
| 7,884,343 B2 | 2/2011 | Lung et al. |
| 7,888,665 B2 * | 2/2011 | Happ et al. .................. 257/2 |
| 8,138,028 B2 | 3/2012 | Lung et al. |
| 8,410,468 B2 * | 4/2013 | Zheng .................. 257/2 |
| 2002/0042158 A1 | 4/2002 | Kersch et al. |
| 2003/0003647 A1 | 1/2003 | Dennison et al. |
| 2003/0215978 A1 | 11/2003 | Maimon et al. |
| 2004/0026686 A1 | 2/2004 | Lung |
| 2004/0114317 A1 | 6/2004 | Chiang et al. |
| 2005/0019975 A1 | 1/2005 | Lee et al. |
| 2005/0127347 A1 | 6/2005 | Choi et al. |
| 2006/0001174 A1 | 1/2006 | Matsui |
| 2006/0003263 A1 | 1/2006 | Chang |
| 2006/0077741 A1 | 4/2006 | Wang et al. |
| 2006/0110878 A1 | 5/2006 | Lung et al. |
| 2006/0175596 A1 | 8/2006 | Happ et al. |
| 2007/0045605 A1 | 3/2007 | Hsueh |
| 2007/0045606 A1 | 3/2007 | Magistretti et al. |
| 2007/0235710 A1 | 10/2007 | Matsuzaki et al. |
| 2007/0246782 A1 | 10/2007 | Philipp et al. |
| 2008/0116441 A1 | 5/2008 | Raghuram et al. |
| 2008/0157053 A1 | 7/2008 | Lai et al. |
| 2008/0272355 A1 * | 11/2008 | Cho et al. .................. 257/2 |
| 2009/0127536 A1 * | 5/2009 | Nirschl et al. .................. 257/4 |
| 2009/0148980 A1 * | 6/2009 | Yu .................. 438/102 |
| 2009/0225588 A1 | 9/2009 | Czubatyj et al. |
| 2009/0298223 A1 | 12/2009 | Cheek et al. |
| 2010/0193763 A1 * | 8/2010 | Chen et al. .................. 257/4 |
| 2010/0291747 A1 | 11/2010 | Lung et al. |
| 2011/0034003 A1 | 2/2011 | Lung |
| 2012/0187362 A1 * | 7/2012 | Lee et al. .................. 257/4 |

OTHER PUBLICATIONS

Hwang Y.N. et al., "Full Integration and Reliability Evalustion of Phase-change RAM Based on 0.24μm-CMOS Technologies," 2003 Symp. on VLSI Technology, Digest of Technical Papers, pp. 173-174.

Lai S. et al., "OUM—A 180 nm Nonvolatile Memory Cell Element Technology for Stand Alone and Embedded Applications," 2001 IEDM, Technical Digest pp. 36.5.1-36.5.4.

Lai, S., "Current Status of the Phase Change Memory and Its Future," IEDM 2003, Technical Digest pp. 10.1.1-10.1.4.

Yamada N., "Potential of Ge—Sb—Te Phase-change Optical Disks for High-Data-Rate Recording," SPIE vol. 3109, 1997, pp. 28-37.

Office Action for corresponding Chinese Application No. 201110285521.2 dated Oct. 23, 2013 consisting of 6 pages.

Chinese Search Report dated Apr. 1, 2013 for application No. 201110285521.2.

Stefan Lai, "Current Status of Phase Change Memory and Its Future", Intel Corporation, 2003.

* cited by examiner

PCRAM WITH CURRENT FLOWING LATERALLY RELATIVE TO AXIS DEFINED BY ELECTRODES

REFERENCE TO RELATED APPLICATIONS

This application claims the benefit of U.S. Provisional Application No. 61/386,389, filed on 24 Sep. 2010, incorporated herein by reference.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND

In phase change memory cells, a limiting factor preventing minimization of the dimensions of the phase change volume is the breakdown voltage. For example, in a memory cell configuration with the phase change volume along a generally vertical current path between top and bottom electrodes, a voltage drop in the phase change volume occurs vertically in the resistive phase change volume. If the voltage drop occurs across a phase change volume that is too thin, then the electric field is too high, and breakdown occurs in the phase change volume. Accordingly, the phase change volume has a minimum thickness to prevent such voltage breakdown. Such a minimum thickness also addresses a read disturb issue. Accordingly, present phase change memory cells must be configured with a phase change material thickness in excess of an amount actually required to display phase change behavior.

In a phase change memory cell configuration, the active region volume (which changes phases) of the phase change material increases with the size of the adjacent heater or contact. Because the active region which undergoes the phase change is a volume with a thickness larger than the maximum width of the adjacent heater or contact, the resulting mushroom-like appearance also lends its name to this phase change memory cell configuration.

In the presentation "Current Status of Phase Change Memory and its Future" by Stefan Lai of Intel Corp. at IEDM 2003, the phase change element has a thickness which exceeds the width of the bottom electrode, such that the phase change element is large enough to support the hemispherical volume of the active region.

SUMMARY

Various embodiments of phase change memory cell have a decreased thickness of the phase change material structure.

The relatively low breakdown voltage of the phase change volume is improved relative to the configuration where the phase change surface is in direct contact with both metal contacts. The breakdown voltage of the phase change volume is increased, by interposing a dielectric such as silicon oxide or silicon nitride between an electrode and the phase change volume. The shape and dimensions of the dielectric may be varied, so long as the elongated path of the voltage difference is achieved.

The voltage difference then occurs in the phase change volume along a relatively elongated path around the dielectric. The size of the electrode is limited, because the surface of a large electrode is equipotential, and so the surface of a large electrode prevents (immediately adjacent to the electrode) the desired voltage difference along the elongated path; the voltage difference in the phase change volume occurs away from the electrodes.

In a memory cell configuration with the phase change volume along a generally vertical current path between top and bottom electrodes, as a result of interposing the dielectric between an electrode and the phase change volume, the voltage drop in the phase change volume occurs laterally in the resistive phase change volume alongside the dielectric. The breakdown voltage is increased, because the longer lateral path supports a decreased electrical field magnitude over a longer distance.

Because of the increased breakdown voltage along the relatively elongated path around the dielectric, the minimum thickness dimension of the phase change material volume is no longer limited by breakdown voltage considerations. Instead, the minimum thickness dimension of the phase change volume is limited by the minimum volume necessary to reliably demonstrate phase change operations. Even when the thickness of the phase change volume is decreased to as little as 1-2 nm, phase change operations are still reliably demonstrated in the smaller active region volume.

Such thinner material phase change material results in decreased active region volume, which decreases reset power and current, increases speed, and improves data retention. The improved data retention results from a thinner phase change material in the amorphous phase which shows preferential behavior of remaining in the amorphous phase. When the thickness of the phase change material is less than about 20 nm, there is substantially less reset current and power and improved data retention.

Unlike a traditional mushroom phase change memory cell configuration, the maximum thickness of the phase change material, adjacent to the heater or contact by the active region, is less than the maximum width of the adjacent heater or contact.

In a memory cell configuration with the phase change volume along a generally vertical current path between top and bottom electrodes, the phase change volume portion by the bottom electrode has a thickness less than the maximum width of the bottom electrode or heater.

One aspect of the technology is a memory device comprising a first electrode, a second electrode, a dielectric structure, and a phase change memory structure.

The second electrode is opposite the first electrode. The dielectric structure is positioned between the first electrode and the second electrode. The phase change memory structure is in contact with the first electrode and in contact with the second electrode. The phase change memory structure surrounds the dielectric structure.

In one embodiment, the dielectric structure has no surface in contact with the first electrode and no surface in contact with the second electrode.

In one embodiment, at least the phase change memory structure is between any surface of the dielectric structure and both the first electrode and the second electrode.

In one embodiment, the phase change memory structure has a thickness less than a width of the first electrode, but greater than half the width of the first electrode.

In one embodiment, the dielectric structure has a plurality of surfaces in contact with the phase change memory structure.

In one embodiment, an active region undergoing phase change is in the part of the phase change memory structure having the thickness proximate to the electrode contact surface of the first electrode.

In one embodiment, an active region undergoing phase change substantially fills the phase change memory structure between the dielectric structure and the first electrode, except for a part of the thickness adjacent to the dielectric structure. The part of the thickness adjacent to the dielectric structure does not undergo phase change, because proximity to the dielectric structure results in a less dense current flow through that proximate portion of the phase change memory structure. Accordingly, the active region in the thickness of the phase change memory structure has a roughly pancake shape or nailhead shape.

In one embodiment, the first electrode comprises heater material.

Another aspect of the technology is a memory device also comprises a first electrode, a second electrode, a dielectric structure, and a phase memory structure.

The first electrode and the second electrode have a current path between the first electrode and the second electrode. In some embodiments, the first electrode is the bottom electrode and the second electrode is the top electrode; other embodiments switch the positions or change the orientation, such as to a side-to-side orientation. The dielectric structure is positioned between the first electrode and the second electrode. The current path between the electrodes runs adjacent to the dielectric structure. The phase change memory structure determines an amount of current in the current path. The phase change memory structure surrounds the dielectric structure.

In one embodiment, the dielectric structure blocks any straight current path between the first and second electrodes, such that a current direction in the first electrode is different from a current direction in at least part of the phase change memory structure between the first and second electrodes.

In one embodiment, an active region undergoing phase change is in part of the phase change memory structure between the dielectric structure and the first electrode. In one embodiment, an active region undergoing phase change substantially fills the phase change memory structure between the dielectric structure and the first electrode, except for a part of the thickness adjacent to the dielectric structure. In one embodiment, an active region of the phase change memory structure has an active width larger than the electrode maximum width.

In one embodiment, the current path in the phase change memory structure is adjacent to the dielectric structure.

In one embodiment, an interface between the first electrode and the phase change memory structure defines a plane, and at least part of the current path runs along the plane. In one embodiment, the first and second electrodes define an axis running between the first and second electrodes, and at least part of the current path runs adjacent to the dielectric structure and perpendicular to the axis.

In one embodiment, the first electrode comprises heater material.

In one embodiment, at least the phase change memory structure is between any surface of the dielectric structure and both the first electrode and the second electrode.

In one embodiment, the phase change memory structure has a thickness less than a width of the first electrode, but greater than half the width of the first electrode. A control circuit performs memory operations on the array that vary properties of an active region of the phase change memory structure Another aspect of the technology is an integrated circuit with an array of memory devices as described herein. The control circuit applies, to a memory device in the array, a reset pulse with sufficient power to substantially fill a part of the phase change memory structure between the dielectric structure and the first electrode with amorphous phase material, while maintaining predetermined regular operation characteristics of the memory device. Examples of predetermined regular operation characteristics are a resistance range, a current range, and a voltage range of the memory device with different phases of the phase change memory structure. Examples of a memory cell in the array are described herein.

Yet another aspect of the technology is a method of making a memory device as described herein.

DETAILED DESCRIPTION

Various embodiments decrease phase change volume thickness. One or more advantages result, such as decreased reset power and reset current.

Figure 1:
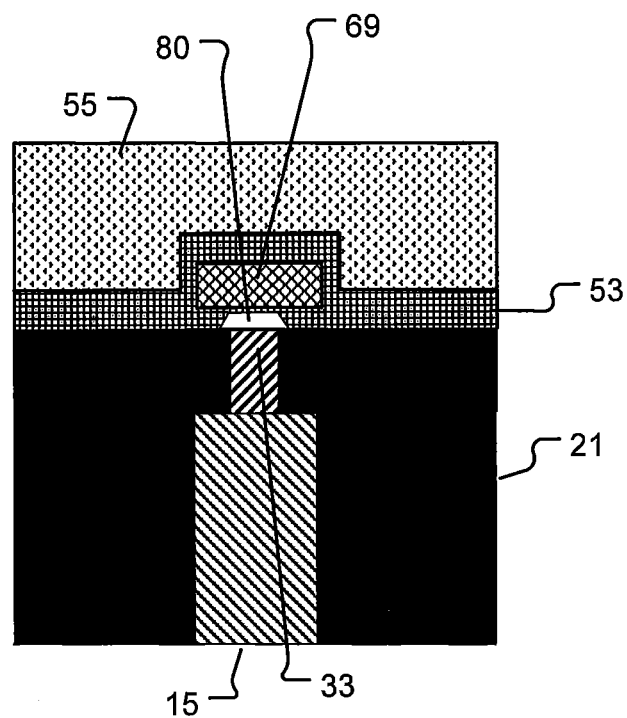
FIG. 1 shows an embodiment of the phase change memory cell with a thin phase change material layer between the oxide and the bottom electrode.

FIG. 1 shows an embodiment of the phase change memory cell with a thin phase change material layer between the oxide and the bottom electrode. Details of making the embodiment of FIG. 1 are discussed below.

Bottom electrode 33 is on contact plug 15. Fill in oxide 21 surrounds bottom electrode 33 and contact plug 15. Phase change material 53 surrounds oxide structure 69. Metal layer/bit line 55 is on phase change material 53. The active region 80 of the phase change material 53 is proximate to the bottom electrode 33; in another embodiment a heater—between the bottom electrode 33 and the phase change material 53, or part of the bottom electrode 33—is proximate to the active region 80 of the phase change material 53. The active region 80 of the phase change memory structure 53 as shown fills the thickness of the phase change memory structure between the oxide structure 69 and the bottom electrode 33. The bottom electrode 33 has an electrode contact surface which is in contact with the phase change material 53. The maximum thickness of the phase change region which is substantially filled with the active region (switching between difference phases) is smaller than the maximum width of the electrode contact surface of the bottom electrode 33. Even when the maximum thickness is substantially filled with amorphous material, the memory cell has regular operational characteristics, such as voltage range, resistance range, or current range of the memory cell.

FIGS. 2-13 show steps in an example manufacturing process to make an embodiment of the phase change memory cell.

Figure 2:
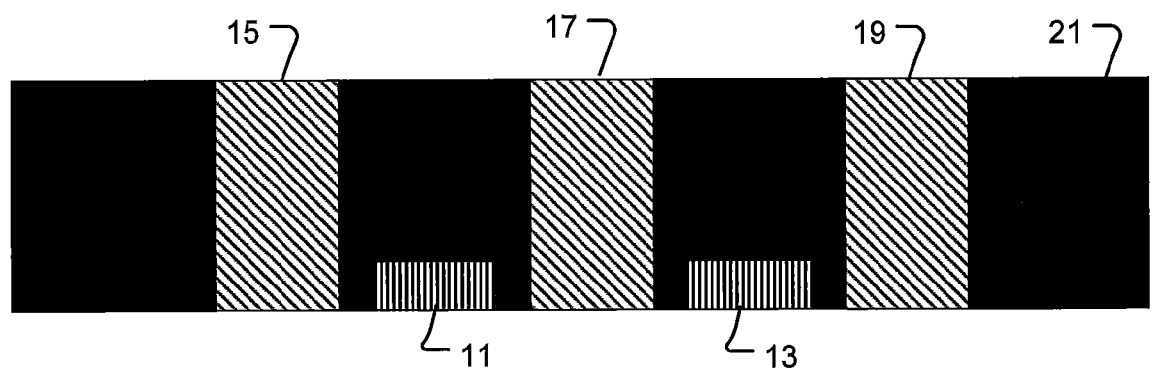
FIGS. 2-13 show steps in an example manufacturing process to make an embodiment of the phase change memory cell.

FIG. 2 shows transistor gates 11 and 13, which respectively control electrical coupling between source line 17 and contact plug 15, and between source line 17 and contact plug 19. Dielectric 21, such as oxide, fills in the volume. The overall structure is on a substrate or well.

FIGS. 3-8 show the formation of the bottom electrode.

Figure 3:
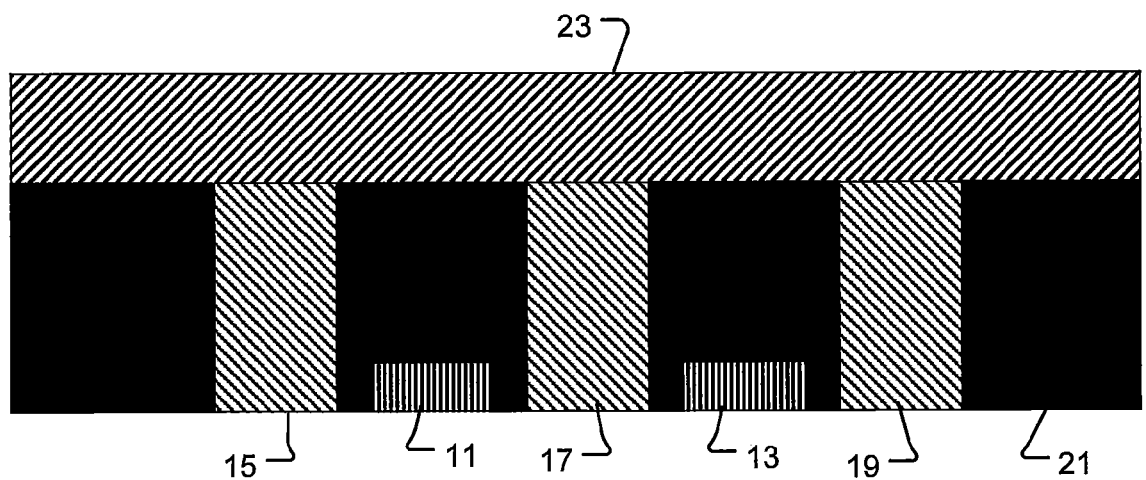
Figure 4:
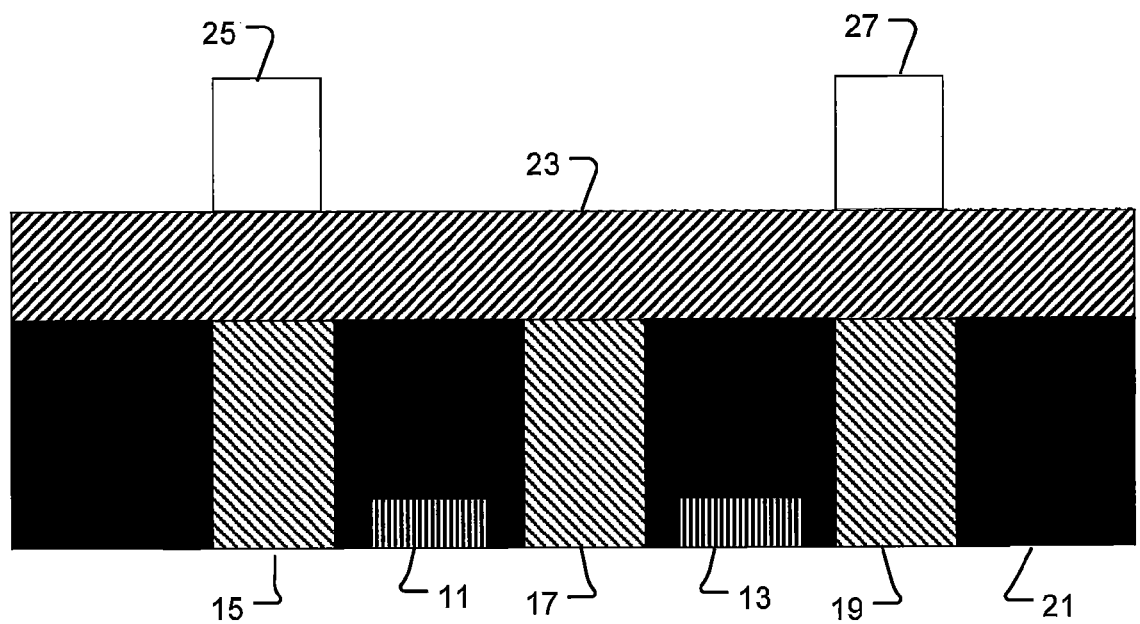
Figure 5:
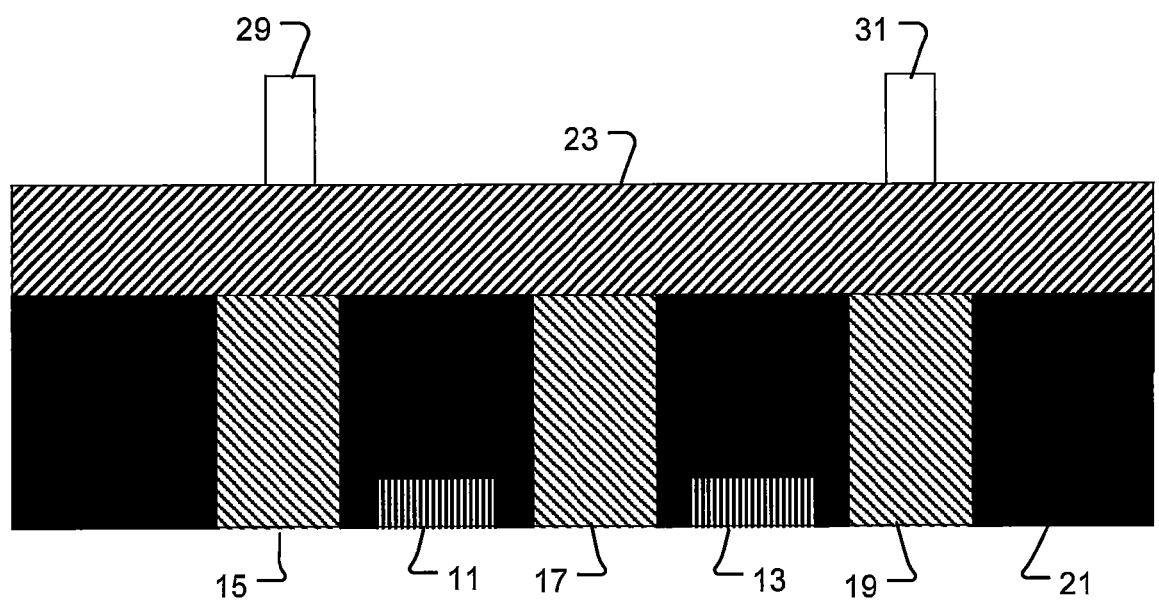
Figure 6:
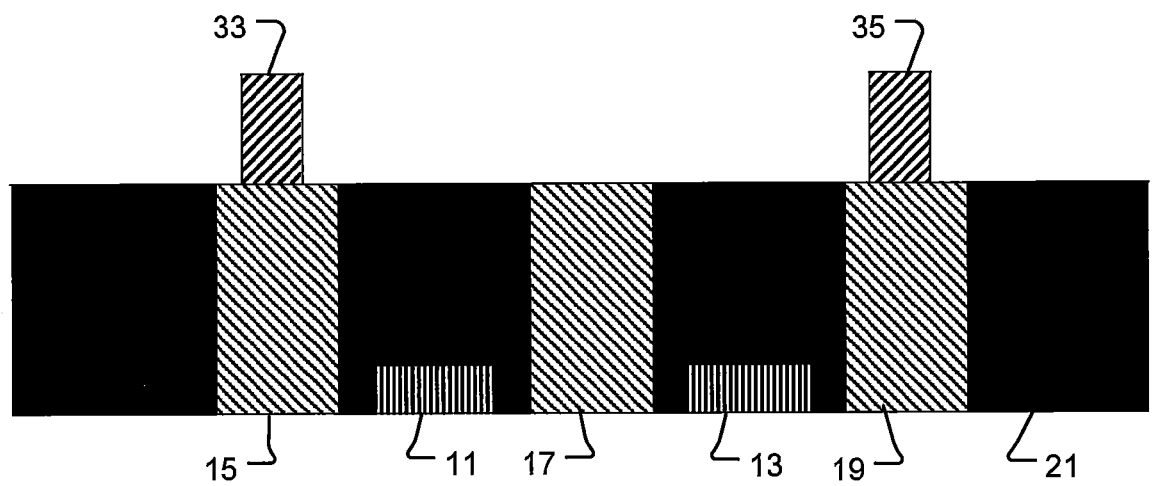
Figure 7:
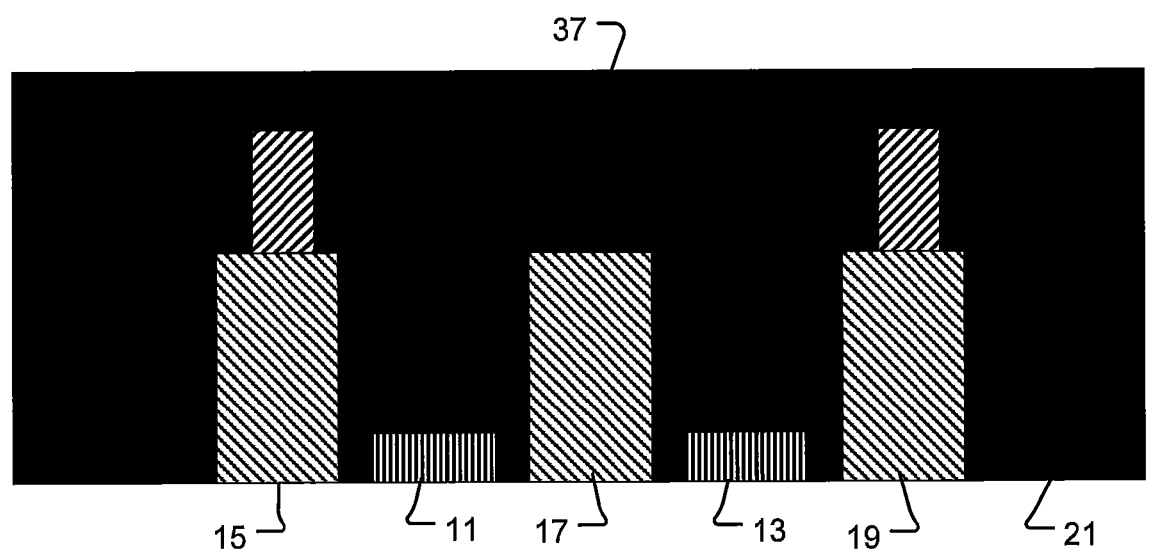
Figure 8:
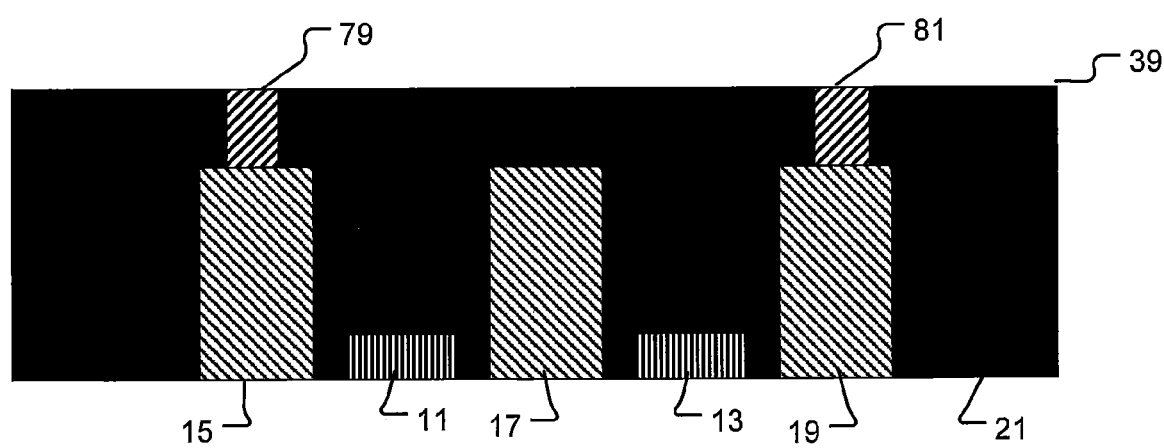

FIG. 3 shows formation of a layer 23 which will become the bottom electrodes of the memory cells, such as TiN, TaN, W, WN, TiAlN or TaAlN, or combination of these materials. FIG. 4 shows formation of a photolithographic layer 25 and 27 which mask the bottom electrode layer 23. FIG. 5 shows trimming of the photolithographic layers 25 and 27 which mask the bottom electrode layer 23; after trimming the narrowed photolithographic layers 29 and 31 more narrowly mask the bottom electrode layer 23. FIG. 6 shows etching of the bottom electrode layer 23, masked by the narrowed photolithographic layers 29 and 31. After etching of the bottom electrode layer 23, the bottom electrodes 33 and 35 remain from the bottom electrode layer 23, and the narrowed photolithographic layers 29 and 31 are removed. FIG. 7 shows filling of the volume with dielectric 37, such as oxide. FIG. 8 shows planarization, such as with chemical mechanical polishing, leaving a planarized interface 39 with bottom electrodes 79 and 81 surrounded by remaining dielectric 37.

FIGS. 9-12 show the formation of the remaining memory cell, including the phase change memory element and the top electrode.

Figure 9:
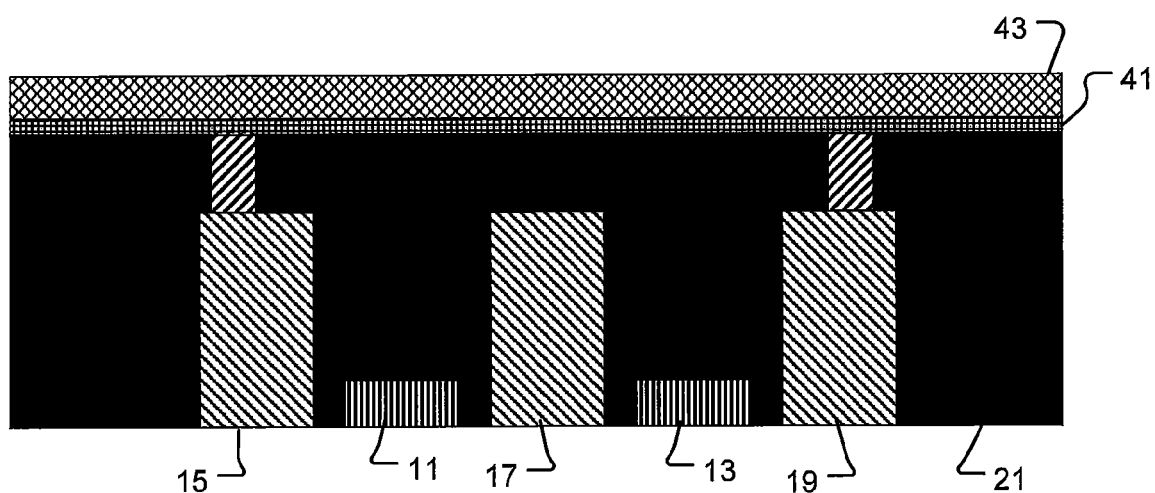
Figure 10:
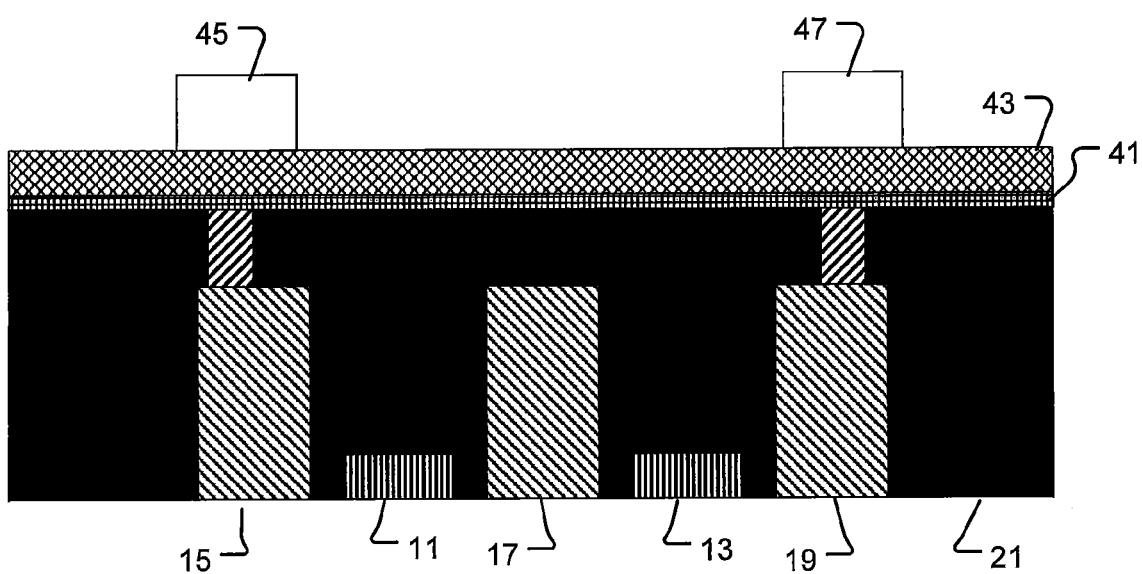
Figure 11:
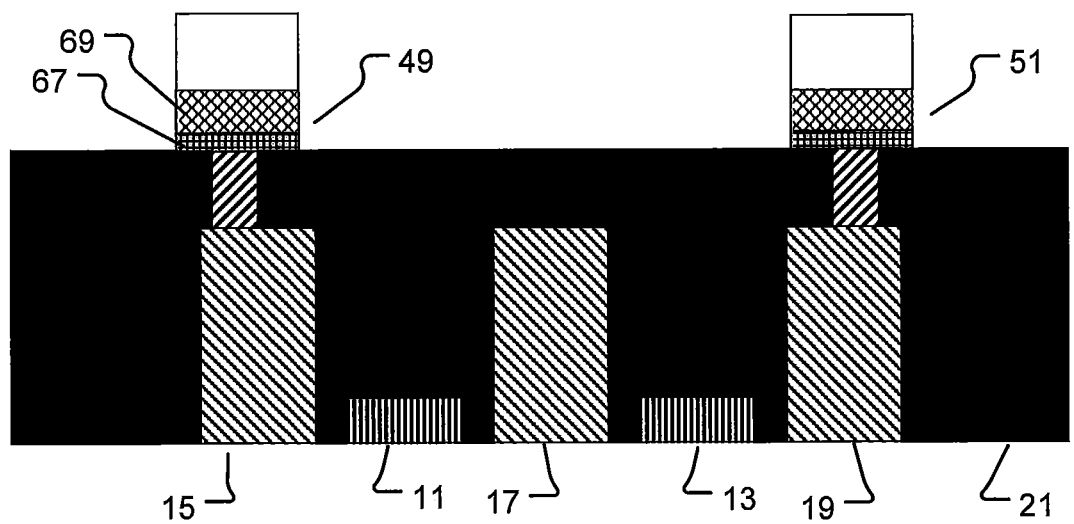
Figure 12:
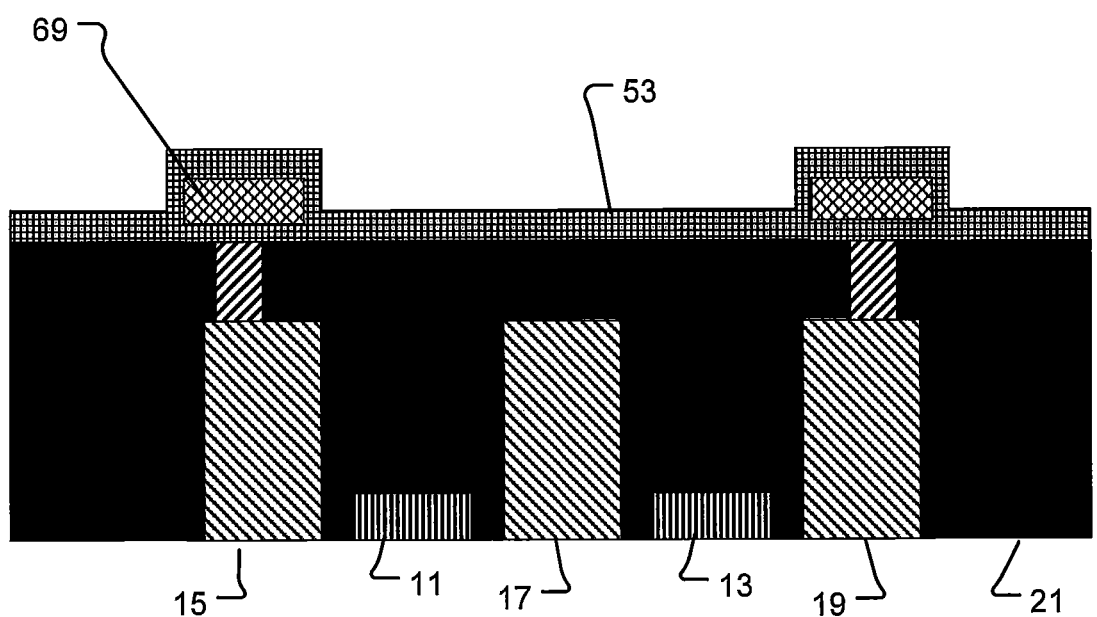

FIG. 9 shows formation of a phase change layer 41 and an oxide layer 43. FIG. 10 shows formation of a photolithographic layer 45 and 47 which mask the phase change layer 41 and the oxide layer 43. FIG. 11 shows etching of the phase change layer 41 and the oxide layer 43, masked by the photolithographic layer 45 and 47. After etching of the phase change layer 41 and the oxide layer 43, memory stacks 49 and 51 remain from the phase change layer 41 and the oxide layer 43, and photolithographic layer 45 and 47 is removed. Memory stack 49 includes phase change element 67 and oxide structure 69. Memory stack 51 includes similar parts. FIG. 12 shows formation of phase change layer 53 which covers the exposed oxide (planarized interface 39) and the oxide structures of the memory stacks, such as oxide structure 69.

Figure 13:
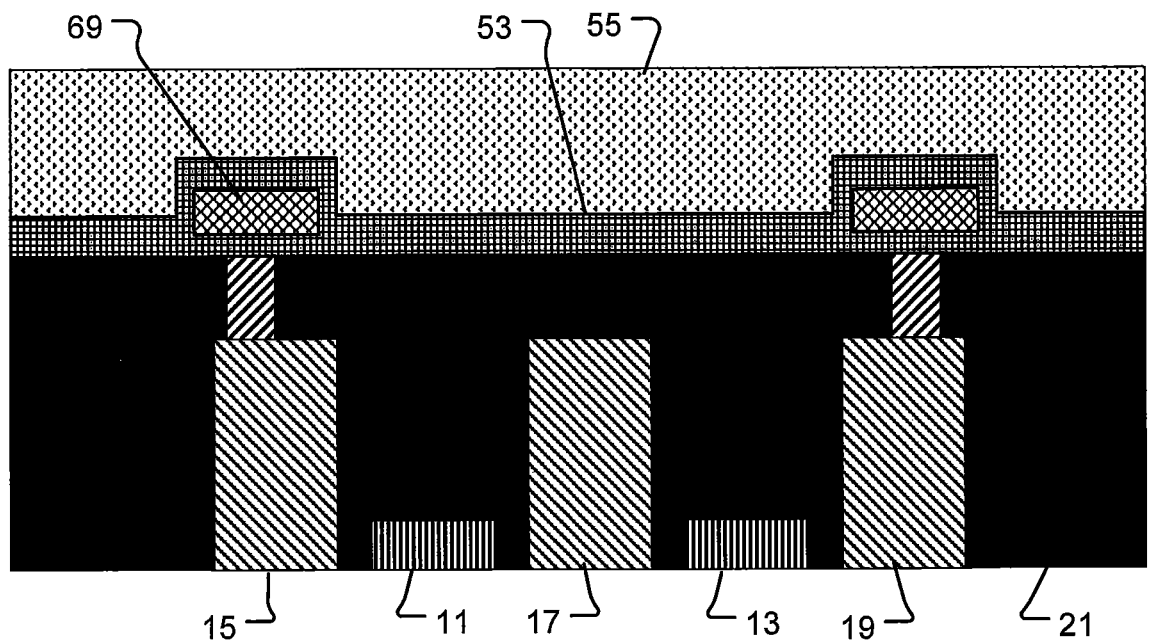

FIG. 13 shows the finished memory device, after deposition of the metal layer 55 and formation of bit lines.

Figure 14:
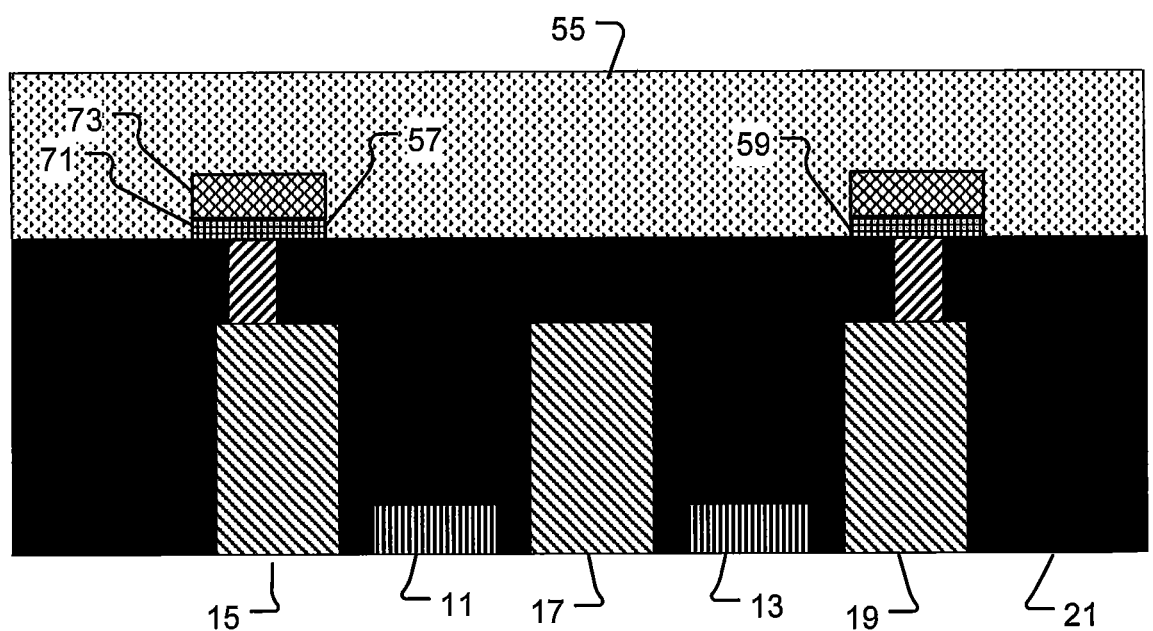
FIG. 14 shows an alternative manufacturing process to make an embodiment of the phase change memory cell with a single deposition of phase change material, where the phase change material contacts the top electrode/bit line through the sides of the phase change material.

FIG. 14 shows an alternative manufacturing process to make an embodiment of the phase change memory cell with a single deposition of phase change material, where the phase change material contacts the top electrode/bit line through the sides of the phase change material.

In FIG. 14, memory stacks 57 and 59 are in the respective memory cells. Memory stack 57 includes phase change element 71 and oxide structure 73. Memory stack 59 includes similar parts. Metal layer 55 is deposited and bit lines are formed. Unlike the embodiment of FIG. 13, prior to the metal layer deposition, there is no phase change layer deposition that covers the memory stacks and exposed oxide.

Figure 15:
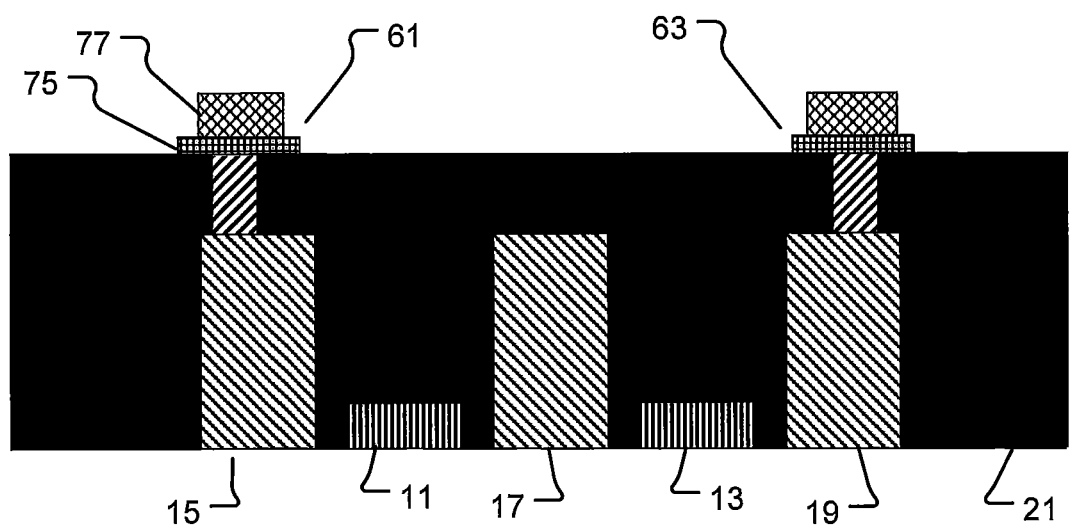
FIGS. 15-16 shows yet another alternative manufacturing process with reduced size dielectric, that increases contact quality between the phase change material and the top electrode/bit line.
Figure 16:
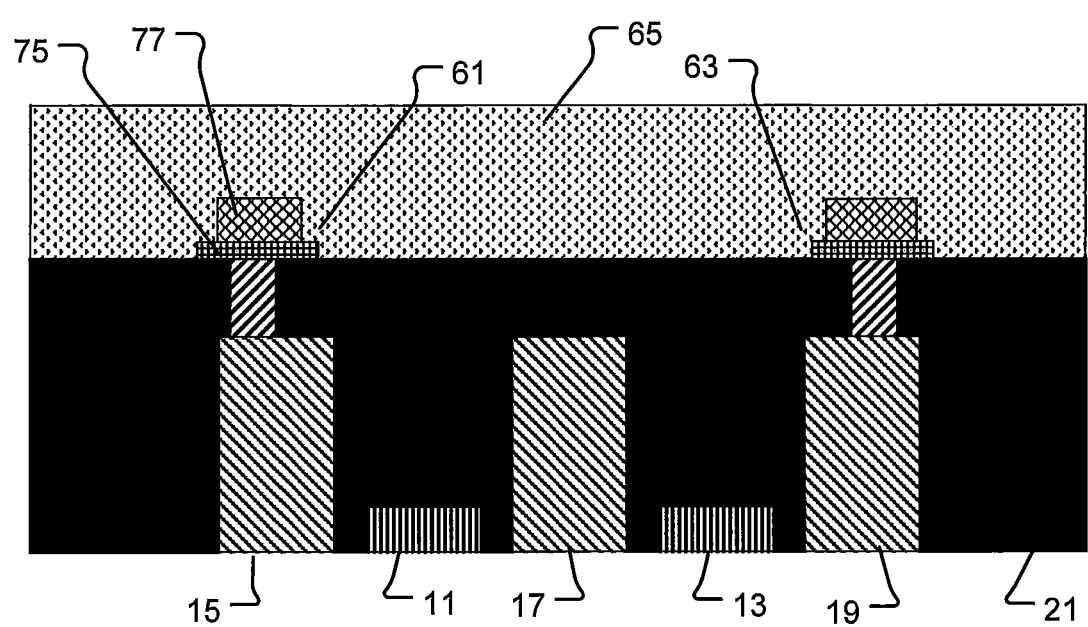

FIGS. 15-16 shows yet another alternative manufacturing process with reduced size dielectric, that increases contact quality between the phase change material and the top electrode/bit line.

In FIG. 15, memory stacks 61 and 63 are in the respective memory cells. Memory stack 61 includes phase change element 75 and oxide structure 77. Memory stack 63 includes similar parts. In FIG. 15, some additional amount of the phase change element 75 is exposed by etching the oxide structure 77. In FIG. 16, metal layer 65 is deposited and bit lines are formed. Unlike the embodiment of FIG. 13, prior to the metal layer deposition, there is no phase change layer deposition that covers the memory stacks and exposed oxide. However, in contrast with the embodiment of FIG. 14, the additional exposure of the phase change element 75 from etching the oxide structure 77 improves contact quality between the phase change element 75 and the metal layer 65.

In some embodiments, the phase change material is formed in a single deposition. In such case, the phase change material contacts the top electrode through the sides. In an embodiment with a phase change material surface exposed (for example by etching back the dielectric formed directly on the phase change material), the phase change material contacts the top electrode through the exposed surface. The size of the exposed surface of the phase change material which contacts the top electrode, may be varied to achieve a good contact surface.

In some embodiments, a second optional deposition of phase change material is laid down for improved contact with the top electrode. This second deposition of GST can be replaced with another material as the adhesion layer, such as a phase change material composition variant. However, the same material will have the best performance.

Various embodiments of the phase change memory cell have a thin phase change material layer between the oxide and the bottom electrode.

The first (bottom) and second (e.g., bit line) electrodes may comprise, for example, TiN or TaN. Alternatively, the first and second electrodes may each be W, WN, TiAlN or TaAlN, or combination of such electrode materials.

The relatively narrow width (which in some embodiments is a diameter) of the first electrode results in an area of contact between the first electrode and the memory element that, in some embodiments, is less than the area of contact between the memory element and the top electrode. Thus current is concentrated in the portion of the memory element adjacent the first electrode, resulting in the active region in contact with or near the bottom electrode. The memory element also includes an inactive region, outside the active region, which is inactive in the sense that it does not undergo phase transitions during operation.

The basis phase change material of memory element in this example comprises $Ge_2Sb_2Te_5$. The basic material can be defined as the combination of elements selected as the phase change material, and deposited with a concentration profile that is characteristic of that material. For example, other basis phase change materials may include $Ge(x) Sb(2y)Te(x+3y)$, where x and y are integers (including 0). Other basic phase change materials other than GeSbTe-based materials can also be used, including GaSbTe system, which can be described as $Ga(x)Sb(x+2y)Te(3y)$, and x, y are integers. Alternatively, the basic phase change material can be selected from a $Ag(x)In(y)Sb2Te3$ system, where x, y decimal numbers that can be below 1.

Figure 17:
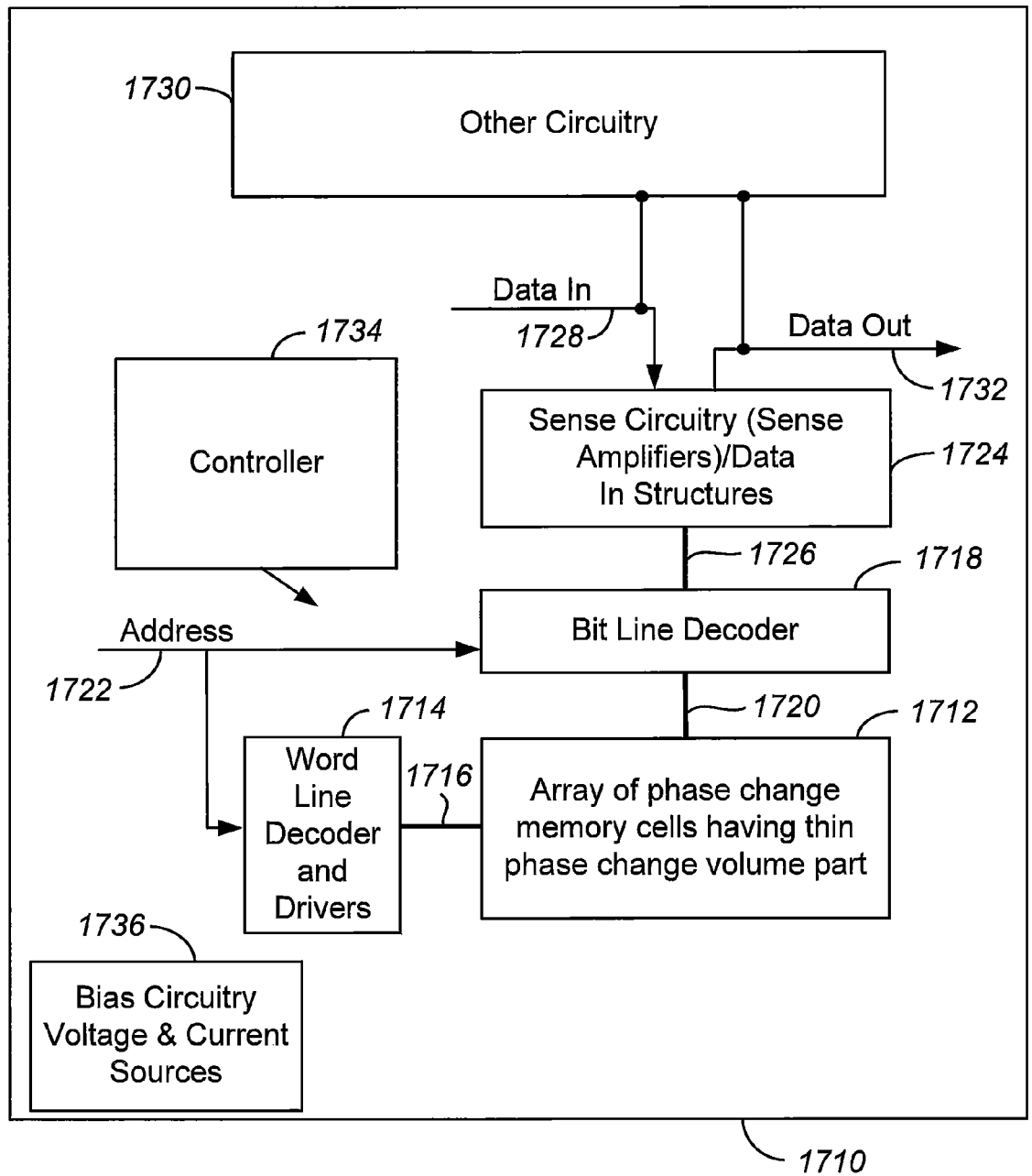
FIG. 17 is a simplified block diagram of an integrated circuit including an array of improved memory cells disclosed herein.

In a reset operation of the memory cell, bias circuitry (See, for example, bias circuitry voltage and current sources of FIG. 17 with the accompanying controller) coupled to the first and second electrodes induces a current to flow between the first and second electrodes via the memory element sufficient to induce a high resistance generally amorphous phase in the phase change domains of the active region to establish a high resistance reset state in the memory cell.

Underlying access circuitry (not shown) can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode and the dielectric layer can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Publication 2008/0191187), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode. Next the mask of photoresist is trimmed, using for example oxygen plasma, to form a mask structure having sublithographic dimensions overlying the location of the first electrode. Then the layer of electrode material is etched using the trimmed mask of photoresist, thereby forming the first electrode having a sublithographic diameter. Next surrounding dielectric material is formed and planarized.

As another example, the first electrode and dielectric can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing" (now U.S. Publication 2009/0072215) which is incorporated by reference herein. For example, the dielectric can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the first electrode. The isolation layer and the sacrificial layers are then selectively etched using the mask, thereby forming a via in the isolation and sacrificial layers and exposing a top surface of the dielectric layer. After removal of the mask, a selective undercutting etch is performed on the via such that the isolation layer is etched while leaving the sacrificial layer and the dielectric layer intact. A fill material is then formed in the via, which, due to the selective undercutting etch process, results in a self-aligned void in the fill material being formed within the via. Next, an anisotropic etching process is performed on the fill material to open the void, and etching continues until the dielectric layer is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer is etched using the sidewall spacers as an etch mask, thereby forming an opening in the dielectric layer having a diameter less than the minimum feature size. Next, an electrode layer is formed within the openings in the dielectric layer. The bottom electrode material deposited into the openings in the dielectric layer may be TiN, TaN, W, WN, TiAlN or TaAlN, or combination of such electrode materials. A planarizing process, such as chemical mechanical polishing CMP, is then performed to remove the isolation layer and the sacrificial layer and to form the first electrode.

A phase change structure is formed, comprising a basic phase change material $Ge_2Sb_2Te_5$. Sputtering is an example. Also, other deposition technologies can be applied, including chemical vapor deposition, atomic layer deposition and so on.

Next, a second electrode is formed and at back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 17 are formed on the device.

In the mushroom cell, the current is concentrated by the bottom electrode, resulting in the active region being adjacent the bottom electrode. Bridge or pillar or pore structures are other configurations of phase change memory cell.

FIG. 17 is a simplified block diagram of an integrated circuit 1710 including a memory array 1712 implemented using memory cells having a phase change structure with a thin layer between an electrode and an oxide as described herein. A word line decoder 1714 having read, set and reset modes is coupled to and in electrical communication with a plurality of word lines 1716 arranged along rows in the memory array 1712. A bit line (column) decoder 1718 is in electrical communication with a plurality of bit lines 1720 arranged along columns in the array 1712 for reading, setting, and resetting the phase change memory cells (not shown) in array 1712. Addresses are supplied on bus 1722 to word line decoder and drivers 1714 and bit line decoder 1718. Sense circuitry (Sense amplifiers) and data-in structures in block 1724, including voltage and/or current sources for the read, set, and reset modes are coupled to bit line decoder 1718 via data bus 1726. Data is supplied via a data-in line 1728 from input/output ports on integrated circuit 1710, or from other data sources internal or external to integrated circuit 1710, to data-in structures in block 1724. Other circuitry 1730 may be included on integrated circuit 1710, such as a general purpose processor or special purpose application circuitry, or a combination of modules providing system-on-a-chip functionality supported by array 1712. Data is supplied via a data-out line 1732 from the sense amplifiers in block 1724 to input/output ports on integrated circuit 1710, or to other data destinations internal or external to integrated circuit 1710.

A controller 1734 implemented in this example, using a bias arrangement state machine, controls the application of bias circuitry voltage and current sources 1736 for the application of bias arrangements including read, program, erase, erase verify and program verify voltages and/or currents for the word lines and bit lines. Controller 1734 may be implemented using special-purpose logic circuitry as known in the art. In alternative embodiments, controller 1734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1734. The controller 1734 applies to a memory device in the array, a reset pulse with sufficient power to fill a part of the phase change memory structure with a maximum thickness of phase change material with amorphous phase material, while maintaining predetermined regular operation characteristics of the memory device.

Figure 18:
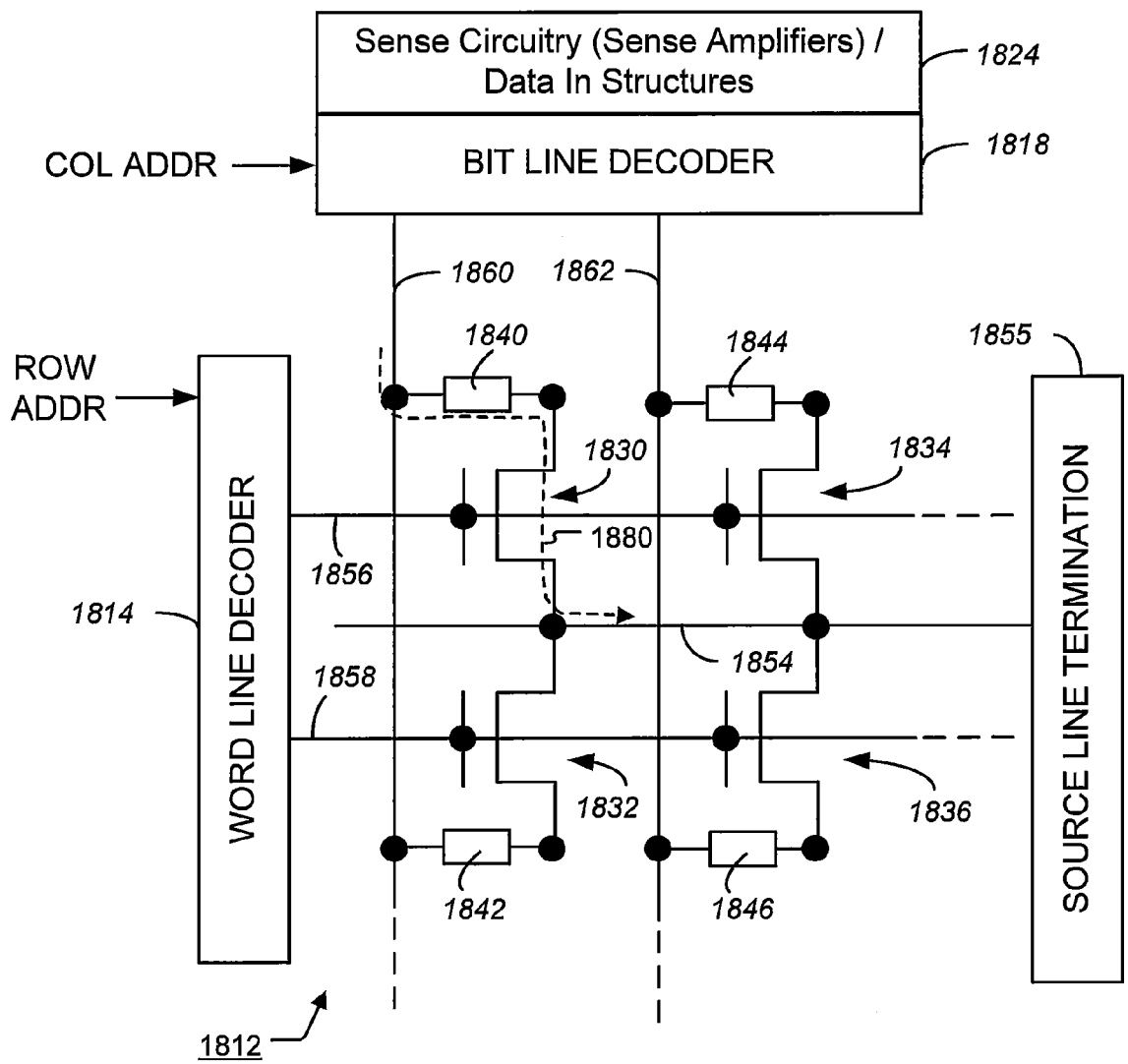
FIG. 18 is a simplified block diagram of an array of improved memory cells disclosed herein, with access circuitry.

As shown in FIG. 18, each of the memory cells of array 1812 includes an access transistor (or other access device such as a diode) and memory element having a phase change structure with a thin layer between an electrode and an oxide as described herein. In FIG. 18 four memory cells 1830, 1832, 1834, 1836 having respective memory elements 1840, 1842, 1844, 1846 are illustrated, representing a small section of an array that can include millions of memory cells.

Sources of each of the access transistors of memory cells 1830, 1832, 1834, 1836 are connected in common to source line 1854 that terminates in a source line termination circuit 1855, such as a ground terminal. In another embodiment the source lines of the access devices are not electrically connected, but independently controllable. The source line termination circuit 1855 may include bias circuitry such as voltage sources and current sources, and decoding circuits for applying bias arrangements, other than ground, to the source line 1854 in some embodiments.

A plurality of word lines including word lines 1856, 1858 extend in parallel along a first direction. Word lines 1856, 1858 are in electrical communication with word line decoder 1814. The gates of access transistors of memory cells 1830 and 1834 are connected to word line 1856, and the gates of access transistors of memory cells 1832 and 1836 are connected in common to word line 1858.

A plurality of bit lines including bit lines 1860, 1862 extend in parallel in a second direction and are in electrical communication with bit line decoder 1818. In the illustrated embodiment each of the memory elements are arranged between the drain of the corresponding access device and the corresponding bit line. Alternatively, the memory elements may be on the source side of the corresponding access device.

It will be understood that the memory array 1812 is not limited to the array configuration illustrated in FIG. 17, and additional array configurations can also be used. Additionally, instead of MOS transistors, bipolar transistors or diodes may be used as access devices in some embodiments.

In operation, each of the memory cells in the array 1812 stores data depending upon the resistance of the corresponding memory element. The data value may be determined, for example, by comparison of current on a bit line for a selected memory cell to that of a suitable reference current by sense amplifiers of sense circuitry 1824. The reference current can be established so that a predetermined range of currents correspond to a logical "0", and a differing range of currents correspond to a logical "1".

Reading or writing to a memory cell of array 1812, therefore, can be achieved by applying a suitable voltage to one of word lines 1858, 1856 and coupling one of bit lines 1860, 1862 to a voltage source so that current flows through the selected memory cell. For example, a current path 1880 through a selected memory cell (in this example memory cell 1830 and corresponding memory element 1840) is established by applying voltages to the bit line 1860, word line 1856, and source line 1854 sufficient to turn on the access transistor of memory cell 1830 and induce current in path 1880 to flow from the bit line 1860 to the source line 1854, or vice-versa. The level and duration of the voltages applied is dependent upon the operation performed, e.g. a reading operation or a writing operation.

In a reset (or program) operation of the memory cell 1830, word line decoder 1814 facilitates providing word line 1856 with a suitable voltage pulse to turn on the access transistor of the memory cell 1830. Bit line decoder 1818 facilitates supplying a voltage pulse to bit line 1860 of suitable amplitude and duration to induce a current to flow though the memory element 1840, the current raising the temperature of the active region of the memory element 1840 above the transition temperature of the phase change material and also above the melting temperature to place the phase change material of the active region in a liquid state. The current is then terminated, for example, by terminating the voltage pulses on the bit line 1860 and on the word line 1856, resulting in a relatively quick quenching time as the active region cools to a high resistance generally amorphous phase in the phase change material in the active region to establish a high resistance reset state in the memory cell 1830.

In a set (or erase) operation of the selected memory cell 1830, word line decoder 1814 facilitates providing word line 1856 with a suitable voltage pulse to turn on the access transistor of the memory cell 1830. Bit line decoder 1818 facilitates supplying a voltage pulse to bit line 1860 of suitable amplitude and duration to induce a current to flow through the memory element 1840, the current pulse sufficient to raise the temperature of the active region above the transition temperature and cause a transition in the phase change material in the active region from the high resistance generally amorphous condition into a low resistance generally crystalline condition, this transition lowering the resistance of the memory element 1840 and setting the memory cell 1830 to the low resistance state. The set operation can also comprise more than one pulse, for example using a pair of pulses.

In a read (or sense) operation of the data value stored in the memory cell 1830, word line decoder 1814 facilitates providing word line 1856 with a suitable voltage pulse to turn on the access transistor of the memory cell 1830. Bit line decoder 1818 facilitates supplying a voltage to bit line 1860 of suitable amplitude and duration to induce current to flow through the memory element 1840 that does not result in the memory element undergoing a change in resistive state. The current on the bit line 1860 and through the memory cell 1830 is dependent upon the resistance of, and therefore the data state associated with, the memory cell. Thus, the data state of the memory cell may be determined by detecting whether the resistance of the memory cell 1830 corresponds to the high resistance state or the low resistance state, for example by comparison of the current on bit line 1860 with a suitable reference current by sense amplifiers of sense circuitry 1824.

The materials used in the embodiment described herein comprise a basis phase change material of $Ge_2Sb_2Te_5$. Other chalcogenides may be used as well. Chalcogens include any of the four elements oxygen (O), sulfur (S), selenium (Se), and Tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60%, and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording," SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Figure 19:
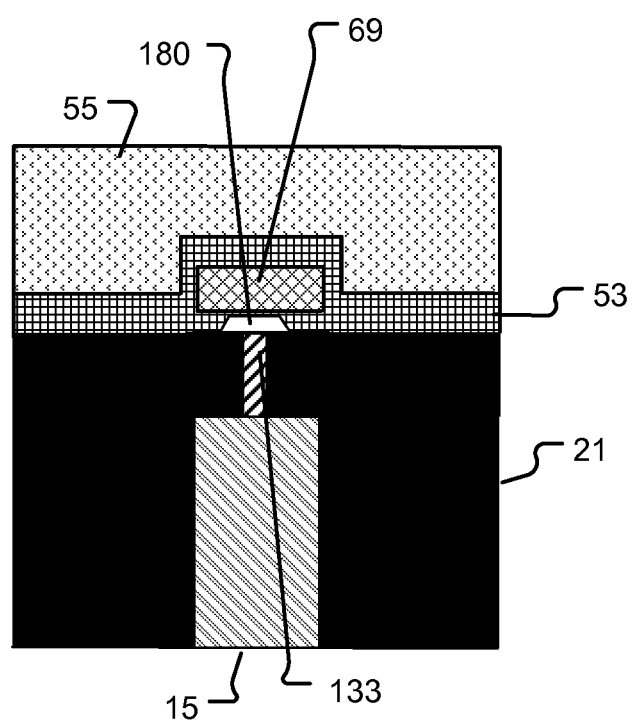
FIG. 19 shows another embodiment of the phase change memory cell with a thin phase change material layer between the oxide and the bottom electrode.

FIG. 19 shows an embodiment of the phase change memory cell with a thin phase change material layer between the oxide and the bottom electrode. Details of making the embodiment of FIG. 19 are similar to FIG. 1. However, the active region 180 of the phase change material has a thickness less than a width of the bottom electrode 133, but greater than half the width of the bottom electrode 133.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a first electrode;
a second electrode opposite the first electrode;
a dielectric structure including a solid material positioned between the first electrode and the second electrode, wherein the dielectric structure has no surface in contact with the first electrode and no surface in contact with the second electrode; and
a phase change memory structure in direct contact with the first electrode and in contact with the second electrode, phase change material in the phase change memory structure completely surrounding the dielectric structure in a cross-section of the memory device such that the phase change material in the phase change memory is in contact with the solid material of the dielectric structure along a complete perimeter of the dielectric structure, the cross-section including the first electrode and the second electrode.

2. The device of claim 1, wherein the phase change memory structure has a thickness less than a width of the first electrode, but greater than half the width of the first electrode.

3. The device of claim 1, wherein at least the phase change memory structure is between any surface of the dielectric structure and both the first electrode and the second electrode.

4. The device of claim 1, wherein the dielectric structure has a plurality of surfaces in contact with the phase change memory structure.

5. The device of claim 1, wherein an active region undergoing phase change is in a part of the phase change memory structure between the dielectric structure and the first electrode.

6. The device of claim 1, wherein an active region undergoing phase change substantially fills a part of the phase change memory structure between the dielectric structure and the first electrode.

7. The device of claim 1, wherein the first electrode comprises heater material.

8. A memory device, comprising:
a first electrode and a second electrode having a current path between the first electrode and the second electrode;
a dielectric structure including a solid material positioned between the first electrode and the second electrode, the current path running adjacent to the dielectric structure, wherein the dielectric structure has no surface in contact with the first electrode and no surface in contact with the second electrode; and
a phase change memory structure determining an amount of current in the current path, phase change material in the phase change memory structure completely surrounding the dielectric structure in a cross-section of the memory device such that the phase change material in the phase change memory is in contact with the solid material of the dielectric structure along a complete perimeter of the dielectric structure, the cross-section including the first electrode and the second electrode.

9. The device of claim 8, wherein the dielectric structure blocks any straight current path between the first and second electrodes, such that a current direction in the first electrode is different from a current direction in at least part of the phase change memory structure between the first and second electrodes.

10. The device of claim 8, wherein an active region undergoing phase change is in part of the phase change memory structure between the dielectric structure and the first electrode.

11. The device of claim 8, wherein an active region undergoing phase change substantially fills a part of the phase change memory structure between the dielectric structure and the first electrode.

12. The device of claim 8, wherein an interface between the first electrode and the phase change memory structure defines a plane, and at least part of the current path runs along the plane.

13. The device of claim 8, wherein the first and second electrodes define an axis running between the first and second electrodes, and at least part of the current path runs adjacent to the dielectric structure and perpendicular to the axis.

14. The device of claim 8, wherein the first electrode comprises heater material.

15. The device of claim 8, wherein at least the phase change memory structure is between any surface of the dielectric structure and both the first electrode and the second electrode.

16. The device of claim 8, wherein the phase change memory structure has a thickness less than a width of the first electrode, but greater than half the width of the first electrode.

17. A integrated circuit, comprising:
an array of memory devices, the memory devices including:
a first electrode;
a second electrode opposite the first electrode;
a dielectric structure including a solid material positioned between the first electrode and the second electrode, wherein the dielectric structure has no surface in contact with the first electrode and no surface in contact with the second electrode;

a phase change memory structure in direct contact with the first electrode and in contact with the second electrode, phase change material in the phase change memory structure completely surrounding the dielectric structure in a cross-section of the memory device such that the phase change material in the phase change memory is in contact with the solid material of the dielectric structure along a complete perimeter of the dielectric structure, the cross-section including the first electrode and the second electrode; and a control circuit applying, to a memory device in the array, a reset pulse with sufficient power to substantially fill a part of the phase change memory structure between the dielectric structure and the first electrode with amorphous phase material, while maintaining predetermined regular operation characteristics of the memory device.

18. The circuit of claim 17, wherein the predetermined regular operation characteristics of the memory device include at least one of a resistance range, a current range, and a voltage range of the memory device with different phases of the phase change memory structure.

19. The circuit of claim 17, wherein at least one memory device of the array has substantially filled a maximum thickness of the phase change memory structure with the amorphous phase material.

20. The circuit of claim 17, wherein the first electrode comprises heater material.

21. The circuit of claim 17, wherein the phase change memory structure has a thickness less than a width of the first electrode, but greater than half the width of the first electrode.

22. The circuit of claim 17, wherein at least the phase change memory structure is between any surface of the dielectric structure and both the first electrode and the second electrode.

* * * * *